United States Patent
Tsai

(10) Patent No.: US 11,029,361 B2
(45) Date of Patent: Jun. 8, 2021

(54) METHOD FOR DETERMINING STATE OF CHARGE AND ELECTRONIC DEVICE THEREOF

(71) Applicant: Acer Incorporated, New Taipei (TW)

(72) Inventor: Chin-Yi Tsai, New Taipei (TW)

(73) Assignee: Acer Incorporated, New Taipei (TW)

( * ) Notice: Subject to any disclaimer, the term of this patent is extended or adjusted under 35 U.S.C. 154(b) by 29 days.

(21) Appl. No.: 16/390,013

(22) Filed: Apr. 22, 2019

(65) Prior Publication Data

US 2020/0182940 A1   Jun. 11, 2020

(30) Foreign Application Priority Data

Dec. 5, 2018   (TW) .................................. 107143779

(51) Int. Cl.
*G01R 31/3835*   (2019.01)
*G01R 31/388*   (2019.01)

(52) U.S. Cl.
CPC ....... *G01R 31/3835* (2019.01); *G01R 31/388* (2019.01)

(58) Field of Classification Search
CPC ........................... G01R 31/3835; G01R 31/388
See application file for complete search history.

(56) References Cited

U.S. PATENT DOCUMENTS

| 2014/0088896 | A1* | 3/2014 | Hu | G01R 31/367 702/63 |
| 2015/0022160 | A1* | 1/2015 | Greening | H02J 7/0077 320/162 |
| 2015/0028808 | A1* | 1/2015 | Bernardi | H02J 7/00712 320/109 |
| 2016/0214500 | A1* | 7/2016 | Kim | H02J 7/0021 |
| 2018/0261893 | A1* | 9/2018 | Fujita | H01M 10/486 |
| 2019/0011505 | A1* | 1/2019 | Park | G01R 31/3835 |
| 2019/0178951 | A1* | 6/2019 | Cha | H01M 10/44 |

FOREIGN PATENT DOCUMENTS

| CN | 102608542 | 7/2012 |
| CN | 102520365 | 10/2015 |

* cited by examiner

*Primary Examiner* — Dominic E Hawkins
(74) *Attorney, Agent, or Firm* — JCIPRNET

(57) ABSTRACT

A method for determining a state of charge adapted for a battery is provided, the method including: obtaining a plurality of discharge curves; determining that the battery is in a discharge mode; measuring a current C-rate and a current voltage of the battery in the discharge mode; selecting a first discharge curve and a second discharge curve from the plurality of discharge curves, wherein a first C-rate corresponding to the first discharge curve is greater than the current C-rate, and a second C-rate corresponding to the second discharge curve is less than the current C-rate; and calculating a state of charge of the battery according to the first discharge curve and the second discharge curve.

8 Claims, 3 Drawing Sheets

METHOD FOR DETERMINING STATE OF CHARGE AND ELECTRONIC DEVICE THEREOF

CROSS REFERENCE TO RELATED APPLICATION

This application claims the priority benefit of Taiwan application serial no. 107143779, filed on Dec. 5, 2018. The entirety of the above-mentioned patent application is hereby incorporated by reference herein and mad a part of this specification.

BACKGROUND OF THE INVENTION

Field of the Invention

The disclosure relates to a method for measuring an electrical variable, and more particularly, to a method for determining a state of charge and an electronic device thereof.

Description of Related Art

At present, methods used to estimate the state of charge (SoC) of a battery in battery management systems are mainly classified into the open circuit voltage (OCV) method, the Coulomb counting method, the Kalman filter method, and the neural network method, and the latter two are the main issues for academic research in recent years. However, the Kalman filter method or the neural network method is more complex and highly dependent on the operation and storage capacities of the micro controller unit (MCU). Therefore, in practice, the open circuit voltage method or the Coulomb counting method is mainly used.

There are many limitations to the implementation of the open circuit voltage method. When the battery is discharging, its voltage drops significantly, and if the open circuit voltage method is used at this time, the obtained state of charge will be lower. After the battery stops discharging, the voltage of the battery will bounce back, and the state of charge measured through the open circuit voltage method at this time will increase along with the rise of the voltage. With the battery uncharged, the user will see that the state of charge of the battery first drops and then bounces back. For users, this is not a desirable user experience. Therefore, in order to avoid the above situation, before the open circuit voltage method is performed, the battery to be measured needs to rest for a period of time.

SUMMARY OF THE INVENTION

In view of the above, the invention provides a method for determining a state of charge and an electronic device thereof, which can be used to determine a state of charge of a battery in a resting mode and a discharge mode without resting the battery to be measured for a period of time.

The invention provides an electronic device including a battery, a storage medium, and a controller. The battery supplies power of the electronic device. The storage medium stores a plurality of discharge curves and a plurality of commands. The controller is coupled to the battery and the storage medium and is configured to execute the plurality of commands. The plurality of commands include the following commands: determining that the battery is in a discharge mode; measuring a current charge and discharge rate (C-rate) and a current voltage of the battery in the discharge mode; selecting a first discharge curve and a second discharge curve from the plurality of discharge curves according to the current C-rate, wherein a first C-rate corresponding to the first discharge curve is greater than the current C-rate, and a second C-rate corresponding to the second discharge curve is less than the current C-rate; and calculating a state of charge of the battery according to the first discharge curve and the second discharge curve.

The invention provides a method for determining a state of charge adapted for a battery. The method includes the following steps: obtaining a plurality of discharge curves; determining that the battery is in a discharge mode; measuring a current C-rate and a current voltage of the battery in the discharge mode; selecting a first discharge curve and a second discharge curve from the plurality of discharge curves according to the current C-rate, wherein a first C-rate corresponding to the first discharge curve is greater than the current C-rate, and a second C-rate corresponding to the second discharge curve is less than the current C-rate; and calculating a state of charge of the battery according to the first discharge curve and the second discharge curve.

Based on the above, the invention can directly calculate the state of charge of the battery in the discharge mode, and when the battery stops discharging, the state of charge will be similar to a state of charge obtained by performing an open circuit voltage method on the battery in the resting mode. Accordingly, the invention can effectively reduce the difference between the state of charge of the battery in the discharge mode and the state of charge of the battery in the resting mode to provide a more desirable user experience.

To make the aforementioned more comprehensible, several embodiments accompanied with drawings are described in detail as follows.

DESCRIPTION OF THE EMBODIMENTS

To overcome the inconvenience caused by the conventional method for measuring a state of charge, the invention provides a method for determining a state of charge and an electronic device thereof. The following description will enable the reader to understand the spirit of creation of the invention.

Figure 1:
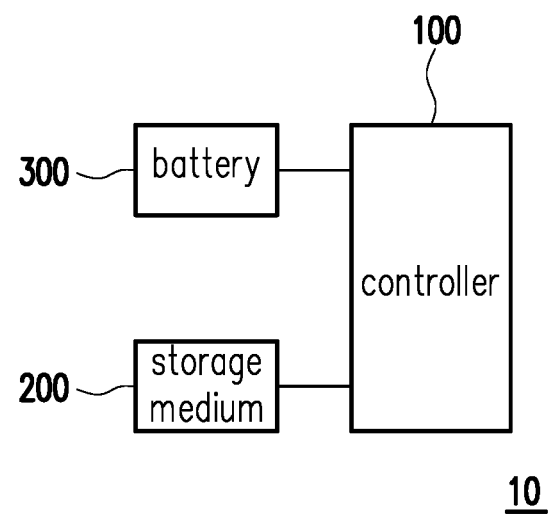
FIG. 1 is a schematic view showing an electronic device according to an embodiment of the invention.

FIG. 1 is a schematic view showing an electronic device 10 according to an embodiment of the invention. The electronic device 10 may include a controller 100, a storage medium 200, and a battery 300. It is noted that, in some embodiments, the electronic device 10 may be used to determine a state of charge of an external battery or an external electronic device. In that case, it is possible that the electronic device 10 does not include the battery 300.

The controller 100 is coupled to the storage medium 200 and the battery 300 and can access and execute a plurality of commands stored in the storage medium 200. The controller 100 may be, for example, a central processing unit (CPU), another programmable microprocessor, digital signal processor (DSP), programmable controller, application specific integrated circuit (ASIC) for general or specific purposes, another similar device, or a combination of the above devices, and the invention is not limited thereto.

The storage medium 200 is used to store various software/data and various commands required for the operation of the electronic device 10. The storage medium 200 may be, for example, a fixed or movable random access memory (RAM), read-only memory (ROM), flash memory, hard disk drive (HDD), solid state drive (SSD) in any form, a similar device, or a combination of the above devices, and the invention is not limited thereto. The storage medium 200 may store a plurality of discharge curves.

The battery 300 is a rechargeable battery such as a lithium battery or a battery of another type, and the invention is not limited thereto. The battery 300 may be used to supply power of the electronic device 10.

Figure 2:
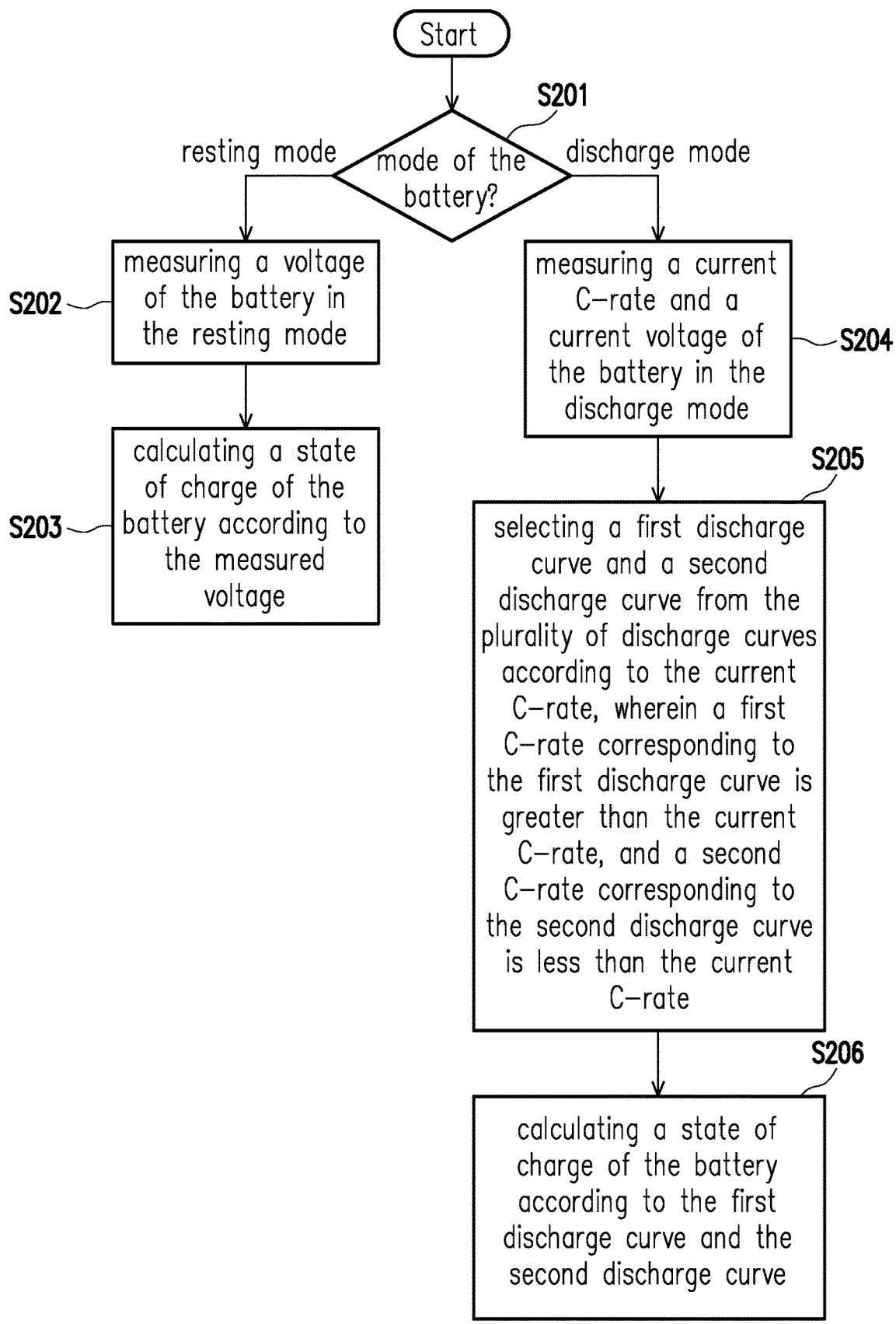
FIG. 2 is a flowchart showing a method for determining a state of charge according to an embodiment of the invention.

FIG. 2 is a flowchart showing a method 20 for determining a state of charge according to an embodiment of the invention, and the method 20 may be implemented by the electronic device 10.

First, before step S201 begins, the electronic device 10 may store a plurality of discharge curves through the storage medium 200 in advance, and the discharge curve represents the relationship between the voltage and the state of charge.

In step S201, the controller 100 may determine a mode of the battery 300. If battery 300 is in a resting mode (i.e., the battery 300 is currently not charging or discharging), then proceed to step S202.

In step S202, the controller 100 may measure the voltage of the battery 300 in the resting mode.

In step S203, the controller 100 may calculate a state of charge of the battery 300 according to the measured voltage. Since the measured voltage of the battery 300 in the resting mode does not bounce back, the controller 100 can measure the voltage of the battery 300 through the open circuit voltage method, for example, and calculate the state of charge of the battery 300.

If the controller 100 determines in step S201 that the battery is in a discharge mode, proceed to step S204. In step S204, the controller 100 may measure a current charge and discharge rate (C-rate) and a current voltage (V) of the battery 300 in the discharge mode.

Figure 3:
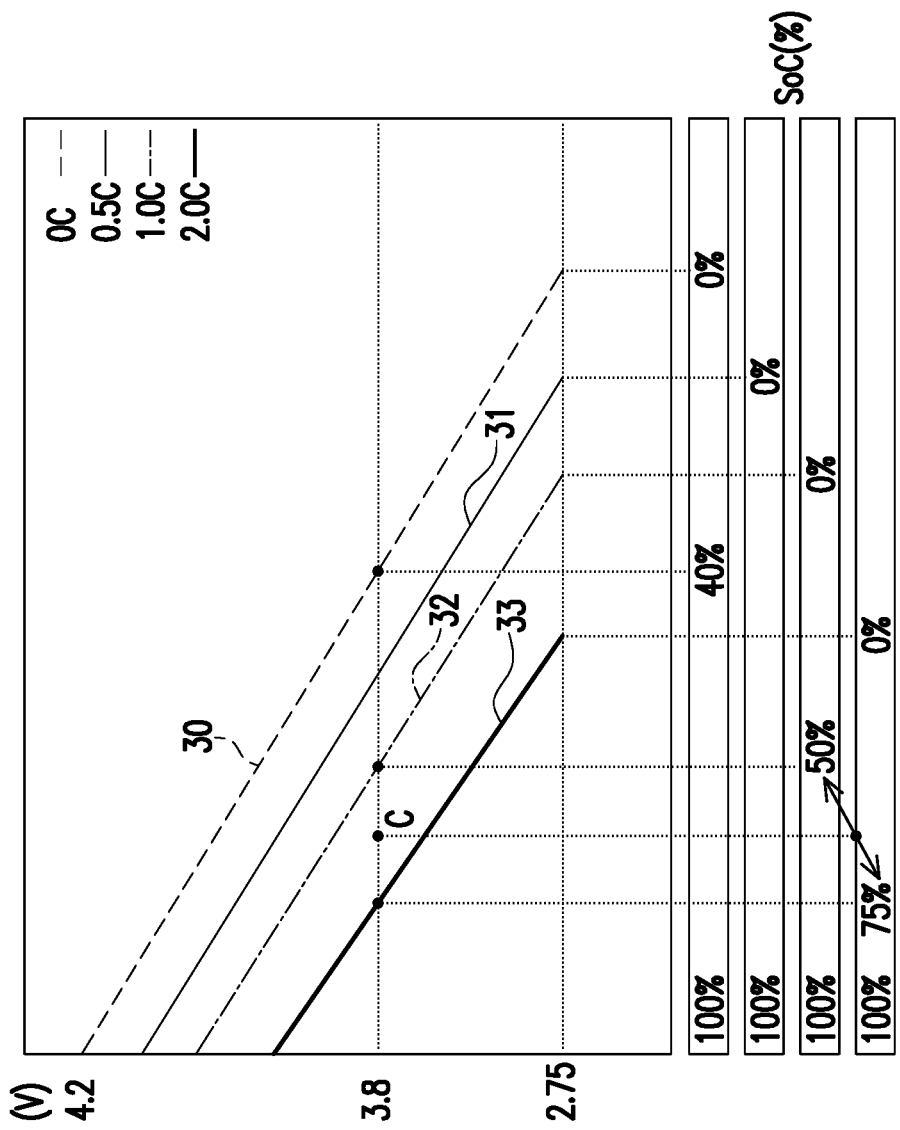
FIG. 3 is a schematic view showing calculation of the state of charge according to the discharge curves according to an embodiment of the invention.

Next, in step S205, the controller 100 may select a first discharge curve and a second discharge curve from the plurality of discharge curves in the storage medium 200 according to the current C-rate. A first C-rate corresponding to the first discharge curve is greater than the current C-rate, and a second C-rate corresponding to the second discharge curve is less than the current C-rate. Taking the discharge curves in FIG. 3 as an example, FIG. 3 is a schematic view showing calculation of the state of charge according to the discharge curves according to an embodiment of the invention. If the current C-rate and the current voltage of the battery 300 measured by the controller 100 in step S204 are respectively 1.5 C and 3.8 V (shown as point C in FIG. 3), then the plurality of discharge curves in the storage medium 200 include a first discharge curve set (i.e., a discharge curve 33) having a C-rate greater than the current C-rate (i.e., 1.5 C) of the battery 300 and include a second discharge curve set (i.e., discharge curves 30, 31, and 32) having a C-rate less than the current C-rate (i.e., 1.5 C) of the battery 300. Specifically, the discharge curve 30 represents a curve in which the C-rate is 0 C, the discharge curve 31 represents a curve in which the C-rate is 0.5 C, the discharge curve 32 represents a curve in which the C-rate is 1.0 C, and the discharge curve 33 represents a curve in which the C-rate is 2.0 C.

The controller 100 may select the discharge curve 33 from the first discharge curve set as the first discharge curve 33, so that among each of the C-rates corresponding to the first discharge curve set, the first C-rate (i.e., the C-rate of 2.0 C of the discharge curve 33) can be closest to the current C-rate (i.e., 1.5 C). In addition, the controller 100 may select the discharge curve 32 from the second discharge curve set as the second discharge curve 32, so that among each of the C-rates (including the C-rates of 1.0 C, 0.5 C, and 0 C) corresponding to the second discharge curve set, the second C-rate (i.e., the C-rate of 1.0 C of the discharge curve 32) can be closest to the current C-rate (i.e., 1.5 C).

Referring to FIG. 2 and FIG. 3 at the same time, in step S206, the controller 100 may calculate a state of charge of the battery 300 according to the first discharge curve 33 and the second discharge curve 32. The controller 100 may perform an interpolation operation on the first discharge curve 33 and the second discharge curve 32 to calculate the state of charge. More specifically, the controller 100 can obtain a first state of charge (i.e., 75%) corresponding to the current voltage (i.e., 3.8 V) from the first discharge curve 33, and can obtain a second state of charge (i.e., 50%) corresponding to the current voltage (i.e., 3.8 V) from the second discharge curve 32. Then, the controller 100 can calculate the state of charge of the battery 300 in the discharge mode according to the current C-rate (i.e., 1.5 C), the first C-rate (i.e., 2.0 C), the second C-rate (i.e., 1.0 C), the first state of charge (i.e., 75%), and the second state of charge (i.e., 50%), as shown in Equation (1).

$$SoC = SoCL + (SoCH - SoCL) \times \left(\frac{Ci - CL}{CH - CL}\right) \quad \text{Equation (1)}$$

where CL<Ci<CH, and SoCL<SoC<SoCH. In Equation (1), SoC indicates the calculated state of charge of the battery 300, SoCH indicates the first state of charge (i.e., 75%), SoCL indicates the second state of charge (i.e., 50%), Ci indicates the current C-rate (i.e., 1.5 C), CH indicates the first C-rate (i.e., 2.0 C), and CL indicates the second C-rate (i.e., 1.0 C). According to Equation (1), the controller 100 can calculate the state of charge of the battery 300 as 62.5%, as shown in Equation (2).

$$SoC = 50 + (75 - 50) \times \frac{(1.5 - 1.0)}{(2.0 - 1.0)} = 62.5 \quad \text{Equation (2)}$$

In summary of the above, the invention can switch the method for determining the state of charge based on the mode of the battery. When the battery is in the discharge mode, the invention can calculate the state of charge of the battery through a plurality of predetermined discharge curves and interpolation operations. Compared to the conventional open circuit voltage method which can only be applied to a battery after resting for a period of time, the invention can directly calculate the state of charge of the battery in the discharge mode, and when the battery stops discharging, the state of charge will be similar to a state of charge obtained by performing an open circuit voltage method on the battery in the resting mode. Accordingly, the invention can effectively reduce the difference between the state of charge of the battery in the discharge mode and the state of charge of the battery in the resting mode to provide a more desirable user experience.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
  a battery, supplying power of the electronic device;
  a storage medium, storing a plurality of discharge curves and a plurality of commands; and
  a controller coupled to the battery and the storage medium, the controller being configured to execute the plurality of commands, wherein the plurality of commands comprise:
    determining that the battery is in a discharge mode;
    measuring a current C-rate and a current voltage of the battery in the discharge mode;
    selecting a first discharge curve and a second discharge curve from the plurality of discharge curves according to the current C-rate, wherein a first C-rate corresponding to the first discharge curve is greater than the current C-rate, and a second C-rate corresponding to the second discharge curve is less than the current C-rate; and
    calculating a state of charge of the battery according to the first discharge curve and the second discharge curve, wherein
  the plurality of discharge curves comprise a first discharge curve set having a C-rate greater than the current C-rate and a second discharge curve set having a C-rate less than the current C-rate,
  among each of C-rates corresponding to the first discharge curve set, the first C-rate is closest to the current C-rate, and
  among each of C-rates corresponding to the second discharge curve set, the second C-rate is closest to the current C-rate.

2. The electronic device according to claim 1, wherein the operation of calculating the state of charge of the battery according to the first discharge curve and the second discharge curve comprises:
  performing an interpolation operation on the first discharge curve and the second discharge curve to calculate the state of charge.

3. The electronic device according to claim 2, wherein the operation of performing the interpolation operation on the first discharge curve and the second discharge curve to calculate the state of charge comprises:
  obtaining a first state of charge corresponding to the current voltage from the first discharge curve;
  obtaining a second state of charge corresponding to the current voltage from the second discharge curve; and
  calculating the state of charge according to the current C-rate, the first C-rate, the second C-rate, the first state of charge, and the second state of charge.

4. The electronic device according to claim 1, wherein the plurality of commands further comprise:
  determining that the battery is in a resting mode;
  measuring a second voltage of the battery in the resting mode; and
  calculating the state of charge of the battery according to the second voltage.

5. A method for determining a state of charge adapted for a battery, the method comprising:
  obtaining a plurality of discharge curves;
  determining that the battery is in a discharge mode;
  measuring a current C-rate and a current voltage of the battery in the discharge mode;
  selecting a first discharge curve and a second discharge curve from the plurality of discharge curves according to the current C-rate, wherein a first C-rate corresponding to the first discharge curve is greater than the current C-rate, and a second C-rate corresponding to the second discharge curve is less than the current C-rate; and
  calculating a state of charge of the battery according to the first discharge curve and the second discharge curve, wherein
  the plurality of discharge curves comprise a first discharge curve set having a C-rate greater than the current C-rate and a second discharge curve set having a C-rate less than the current C-rate,
  among each of C-rates corresponding to the first discharge curve set, the first C-rate is closest to the current C-rate, and
  among each of C-rates corresponding to the second discharge curve set, the second C-rate is closest to the current C-rate.

6. The method according to claim 5, wherein the step of calculating the state of charge of the battery according to the first discharge curve and the second discharge curve comprises:
  performing an interpolation operation on the first discharge curve and the second discharge curve to calculate the state of charge.

7. The method according to claim 6, wherein the step of performing the interpolation operation on the first discharge curve and the second discharge curve to calculate the state of charge comprises:
  obtaining a first state of charge corresponding to the current voltage from the first discharge curve;
  obtaining a second state of charge corresponding to the current voltage from the second discharge curve; and
  calculating the state of charge according to the current C-rate, the first C-rate, the second C-rate, the first state of charge, and the second state of charge.

8. The method according to claim 5, further comprising:
  determining that the battery is in a resting mode;
  measuring a second voltage of the battery in the resting mode; and
  calculating the state of charge of the battery according to the second voltage.

* * * * *